US009800012B2

United States Patent
Tokito

(10) Patent No.: US 9,800,012 B2
(45) Date of Patent: Oct. 24, 2017

(54) CONTROL APPARATUS FOR CONTROLLING LASER OSCILLATOR

(71) Applicant: FANUC CORPORATION, Yamanashi (JP)

(72) Inventor: Hiroaki Tokito, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 15/367,581

(22) Filed: Dec. 2, 2016

(65) Prior Publication Data
US 2017/0163002 A1 Jun. 8, 2017

(30) Foreign Application Priority Data
Dec. 4, 2015 (JP) .................................. 2015-237846

(51) Int. Cl.
| | |
|---|---|
| H01S 3/13 | (2006.01) |
| H01S 3/23 | (2006.01) |
| H01S 5/068 | (2006.01) |
| H01S 3/10 | (2006.01) |

(52) U.S. Cl.
CPC .......... *H01S 3/1305* (2013.01); *H01S 3/2383* (2013.01); *H01S 5/06808* (2013.01); *H01S 5/06825* (2013.01); *H01S 3/10069* (2013.01)

(58) Field of Classification Search
CPC .. H01S 3/1305; H01S 3/2383; H01S 3/10069; H01S 5/0617; H01S 5/06808; H01S 5/06825
See application file for complete search history.

(56) References Cited

U.S. PATENT DOCUMENTS 9,261,794 B1 * 2/2016 Ahlawat .................... H01S 3/22
2005/0030986 A1 * 2/2005 Farrell .................... H01S 5/06256
372/32

FOREIGN PATENT DOCUMENTS

JP 2006-156634 A 6/2006

* cited by examiner

*Primary Examiner* — Xinning Niu
(74) *Attorney, Agent, or Firm* — RatnerPrestia

(57) ABSTRACT

A control apparatus for a laser oscillator includes an abnormality determining unit which determines an abnormality of a first assembly based on a first deviation between a first laser beam output command and a first laser beam output and which determines an abnormality of a second assembly based on a second deviation between a second laser beam output command and a second laser beam output, a command unit for issuing a predetermined current command to at least one of a first power unit and a second power unit when the abnormality determining unit determines that at least one of the first assembly and the second assembly has an abnormality, and an abnormality determination stopping unit for stopping the abnormality determining unit from determining an abnormality when the predetermined current command is issued.

7 Claims, 5 Drawing Sheets

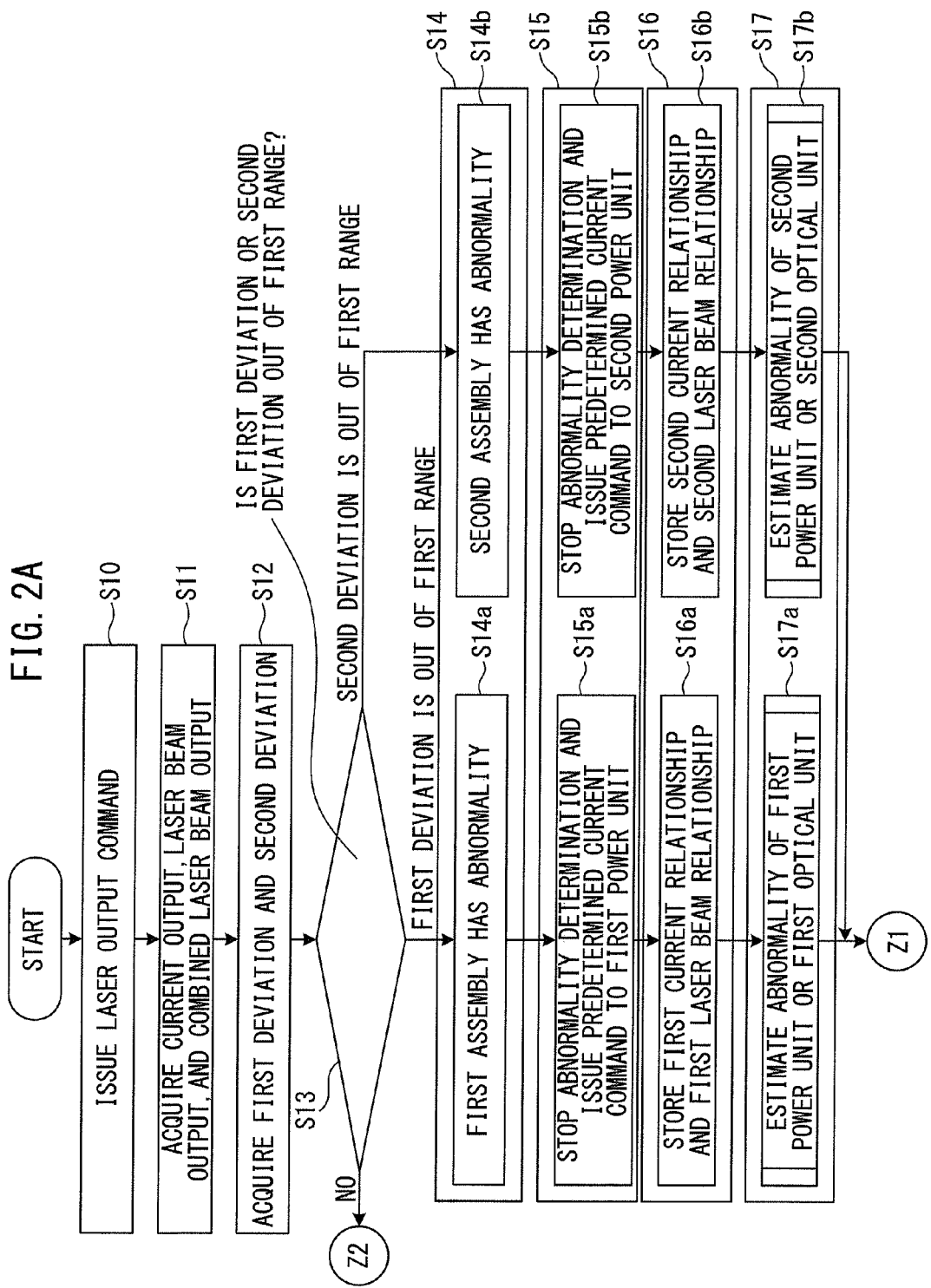

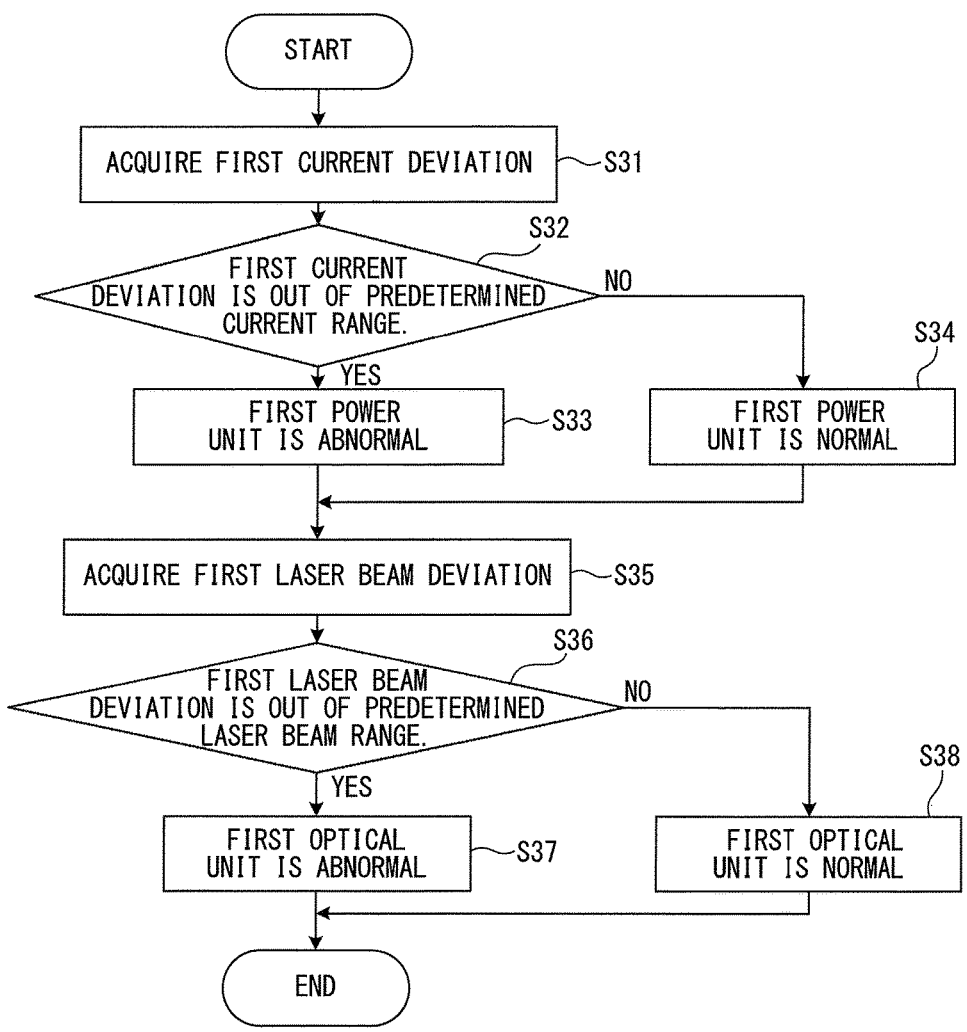

CONTROL APPARATUS FOR CONTROLLING LASER OSCILLATOR

BACKGROUND OF THE INVENTION

1. Field of the Invention

The present invention relates to a control apparatus for controlling a laser oscillator at least including an optical unit and a power unit.

2. Description of the Related Art

In general, a laser oscillator is connected to a laser processing machine for processing a workpiece. As disclosed in Japanese Unexamined Patent Publication (Kokai) No. 2006-156634, the laser oscillator includes at least one optical unit and a power unit for driving the at least one optical unit. Further, when the laser oscillator includes a plurality of optical units, the laser oscillator may include a combine unit for combining laser beams output from the plurality of optical units, to output the combined beam. In short, the laser oscillator includes a plurality of units.

SUMMARY OF THE INVENTION

If an abnormality occurs in any of the units when such a laser oscillator outputs a laser beam, an operator should open a cabinet of the laser oscillator, to confirm the state of each unit. The laser oscillator includes a plurality of units including a power unit, an optical unit, and a combine unit, and accordingly, it requires significant time to determine which unit has an abnormality.

If an alarm is issued to inform that an abnormality has occurred when a laser beam is output, and then the inside of the laser oscillator is checked, the laser oscillator should be electrically and physically separated from a laser processing machine system. Depending on the environmental conditions, for example, temperature and moisture around the laser oscillator, condensation may occur when the cabinet of the laser oscillator is open. Such condensation may cause a failure in a unit having no abnormality.

The present invention was made in light of the circumstances described above and has an object to provide a control apparatus such that the state, etc., of each unit of the laser oscillator can be checked without opening of the inside of the laser oscillator.

To achieve the above object, according to a first aspect of the invention, there is provided a control apparatus for controlling a laser oscillator including a first assembly comprised of a first power unit and a first optical unit having at least one light source driven by the first power unit, and a second assembly comprised of a second power unit and a second optical unit having at least one light source driven by the second power unit. The control apparatus includes a laser beam output command control unit, a monitoring unit, an abnormality determining unit, a command unit, an abnormality determination stopping unit, a storage unit, and an estimation unit. The laser beam output command control unit controls a first laser beam output command for the first optical unit and a second laser beam output command for the second optical unit. The monitoring unit monitors a first current output from the first power unit and a second current output from the second power unit, and a first laser beam output from the first optical unit and a second laser beam output from the second optical unit. The abnormality determining unit determines an abnormality of the first assembly based on a first deviation between the first laser beam output command and the first laser beam output, and determines an abnormality of the second assembly based on a second deviation between the second laser beam output command and the second laser beam output. The command unit issues a predetermined current command to at least one of the first power unit and the second power unit when the abnormality determining unit determines that at least one of the first assembly and the second assembly has an abnormality. The abnormality determination stopping unit stops the abnormality determining unit from determining an abnormality when at least one of the first power unit and the second power unit is driven based on the predetermined current command. The storage unit stores, when at least one of the first power unit and the second power unit is driven based on the predetermined current command, at least one of a first current relationship between the predetermined current command and the first current output monitored by the monitoring unit, a second current relationship between the predetermined current command and the second current output monitored by the monitoring unit, a first laser beam relationship between the first laser beam output command of the first optical unit, which corresponds to the predetermined current command, and the first laser beam output monitored by the monitoring unit, and a second laser beam relationship between the second laser beam output command of the second optical unit, which corresponds to the predetermined current command, and the second laser beam output monitored by the monitoring unit. The estimation unit estimates an abnormality in at least one of the first power unit, the second power unit, the first optical unit, and the second optical unit, based on at least one of the first current relationship, the second current relationship, the first laser beam relationship, and the second laser beam relationship, which are stored by the storage unit.

According to a second aspect of the invention, the control apparatus according to the first aspect of the invention further includes a combine unit for combining the first laser beam output from the first optical unit and the second laser beam output from the second optical unit, to output the combined output. The monitoring unit further monitors a combined laser beam output combined by the combine unit. The estimation unit further estimates an abnormality in the combine unit based on the combined laser beam output.

According to a third aspect of the invention, in the control apparatus according to the first or second aspect of the invention, when the abnormality determining unit determines that one of the first assembly and the second assembly has an abnormality, the command unit first issues the predetermined current command to a power unit for the other of the first assembly and the second assembly, and subsequently issues the predetermined current command to a power unit for the one of the first assembly and the second assembly.

According to a fourth aspect of the invention, in the control apparatus according to any of the first to third aspects of the invention, the predetermined current command is a simmer current command.

According to a fifth aspect of the invention, in the control apparatus according to any of the first to fourth aspects of the invention, the predetermined current command is output for a predetermined period of time.

According to a sixth aspect of the invention, in the control apparatus according to any of the first to third aspects of the invention, the predetermined current command is changed in a stepwise manner from a simmer current command to a maximum rated output command.

According to a seventh aspect of the invention, there is provided a control apparatus for controlling a laser oscillator including an assembly comprised of a power unit and an optical unit having at least one light source driven by the power unit. The control apparatus includes a laser beam output command control unit, a monitoring unit, an abnormality determining unit, a command unit, an abnormality determination stopping unit, a storage unit, and an estimation unit. The laser beam output command control unit controls a laser beam output command for the optical unit. The monitoring unit monitors a current output from the power unit and a laser beam output from the optical unit. The abnormality determining unit determines that the assembly has an abnormality when a deviation between the laser beam output command and the laser beam output is larger than a predetermined threshold value. The command unit issues a predetermined current command to the power unit when the abnormality determining unit determines that the assembly has an abnormality. The abnormality determination stopping unit stops the abnormality determining unit from determining an abnormality when the power unit is driven based on the predetermined current command. The storage unit stores, when the power unit is driven based on the predetermined current command, a current relationship between the predetermined current command and the current output monitored by the monitoring unit, and a laser beam relationship between a laser beam output command of the optical unit, which corresponds to the predetermined current command, and the laser beam output monitored by the monitoring unit. The estimation unit estimates an abnormality in at least one of the power unit and the optical unit, based on at least one of the current relationship stored by the storage unit and the laser beam relationship.

These objects, features, and advantages of the present invention and other objects, features, and advantages will become further clear from the detailed description of typical embodiments illustrated in the appended drawings.

BRIEF DESCRIPTION OF THE DRAWINGS

FIG. 2A is a first flowchart of the operation of the control apparatus shown in FIG. 1.

FIG. 3 is a flowchart of determination made by an estimation unit which determines an abnormality in a first power unit or a first optical unit.

DETAILED DESCRIPTION

Figure 1:
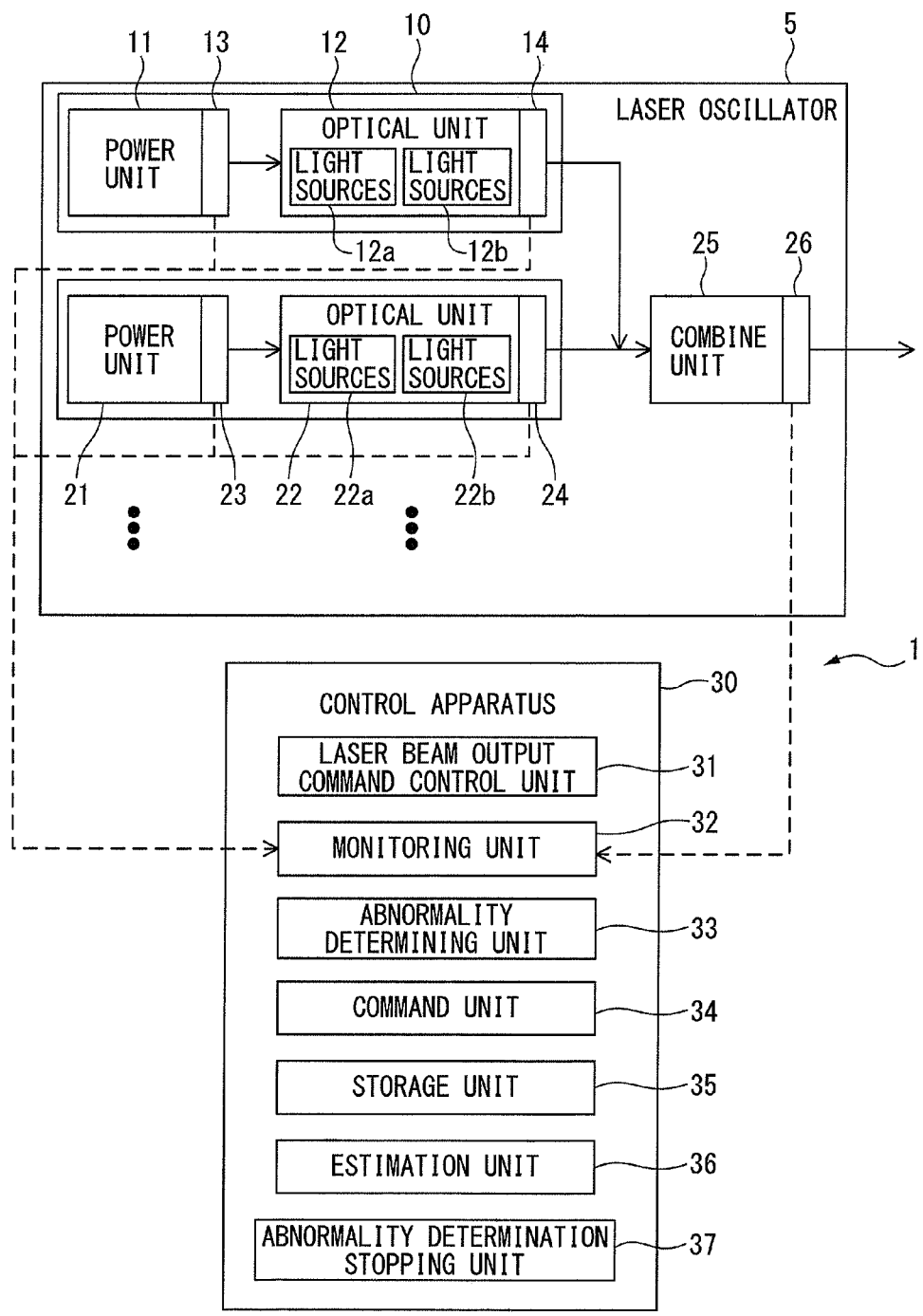
FIG. 1 is a block diagram of the function of a control apparatus according to the present invention.

Embodiments of the present invention will be described below with reference to the accompanying drawings. In the following figures, similar members are designated with the same reference numerals. These figures are properly modified in scale to assist the understanding thereof.

FIG. 1 is a block diagram of the function of a control apparatus according to the present invention. A system 1 shown in FIG. 1 mainly includes a laser oscillator 5 and a control apparatus 30 for controlling the laser oscillator 5. Note that the system 1 may include a laser processing machine for processing a workpiece using a laser beam output from the laser oscillator 5, although the laser processing machine is not illustrated.

As shown in FIG. 1, the laser oscillator 5 includes a first assembly 10 comprised of a first power unit 11 and a first optical unit 12, and a second assembly 20 comprised of a second power unit 21 and a second optical unit 22. The first optical unit 12 includes at least one of light sources 12a and 12b, and the second optical unit 22 includes at least one of light sources 22a and 22b.

Note that the first power unit 11 drives the light sources 12a and 12b of the first optical unit 12, and the second power unit 21 drives the light sources 22a and 22b of the second optical unit 22. Further, the first optical unit 12 and second optical unit 22 each have, for example, a resonance tube or discharge electrodes, and output a laser beam by a known method.

Note that the first assembly 10 and the second assembly 20 have the same configuration. The laser oscillator 5 may also include at least one additional assembly (not shown) composed of a power unit and an optical unit.

As shown in FIG. 1, when the laser oscillator 5 includes the assemblies 10 and 20, the laser oscillator 5 may further include a combine unit 25 common to these assemblies. The combine unit 25 combines laser beams output from the first optical unit 12 of the first assembly 10 and the second optical unit 22 of the second assembly 20, to output the combined beam.

As can be seen from FIG. 1, the first power unit 11 and the second power unit 21 are respectively provided with a first current detecting unit 13 and a second current detecting unit 23 for detecting the values of electric current actually passing through the first power unit 11 and the second power unit 21.

Further, the first optical unit 12, the second optical unit 22, and the combine unit 25 are respectively provided with laser beam detecting units 14, 24, and 26 for respectively detecting the intensities of laser beams output from the units 12, 22, and 25. The current values detected by the current detecting units 13 and 23 and the laser beam outputs detected by the laser beam detecting units 14, 24, and 26 are supplied to a monitor unit 32 that will be described later.

The control apparatus 30 is a digital computer which controls the operation of the laser oscillator 5. As shown in FIG. 1, the control apparatus 30 includes a laser beam output command control unit 31 for controlling a first laser beam output command for the first optical unit 12 and a second laser beam output command for the second optical unit 22.

The control apparatus 30 also includes a monitor unit 32 for monitoring a first current output from the first power unit 11 and a second current output from the second power unit 21, and a first laser beam output from the first optical unit 12 and a second laser beam output from the second optical unit 22. The monitor unit 32 further monitors a combined laser beam output combined by the combine unit 25.

The control apparatus 30 also includes an abnormality determining unit 33, which determines that an abnormality has occurred in the first assembly when a first deviation between the first laser beam output command and the first laser beam output is out of a predetermined first range and which determines that an abnormality has occurred in the second assembly when a second deviation between the second laser beam output command and the second laser beam output is out of a predetermined first range.

The control apparatus 30 also includes a command unit 34 for issuing a predetermined current command to at least one of the first power unit 11 and the second power unit 21 when the abnormality determining unit 33 determines that an abnormality has occurred in at least one of the first assembly 10 and the second assembly 20, and an abnormality determination stopping unit 37 for stopping the determination of abnormality by the abnormality determining unit 33 when at least one of the first power unit 11 and the second power unit 21 is driven based on the predetermined current command.

The control apparatus 30 also includes a storage unit 35 for storing, when at least one of the first power unit 11 and the second power unit 21 is driven based on a predetermined current command, at least one of a first current relationship between the predetermined current command and the first current output monitored by the monitor unit 32, a second current relationship between the predetermined current command and the second current output monitored by the monitor unit 32, a first laser beam relationship between the first laser beam output command of the first optical unit 12, which corresponds to the predetermined current command, and the first laser beam output monitored by the monitor unit 32, and a second laser beam relationship between the second laser beam output command of the second optical unit 22, which corresponds to the predetermined current command, and the second laser beam output monitored by the monitor unit 32. Note that the first laser beam output command of the first optical unit 12, which corresponds to the predetermined current command, etc., may be made by the laser beam output command control unit 31.

The control apparatus 30 also includes an estimation unit 36 for estimating an abnormality of at least one of the first power unit 11, the second power unit 21, the first optical unit 12, and the second optical unit 22 based on at least one of the first current relationship, the second current relationship, the first laser beam relationship, and the second laser beam relationship stored by the storage unit 35. Note that the estimation unit 36 further estimates an abnormality of the combine unit 25 based on the combined laser beam output.

Figure 2B:
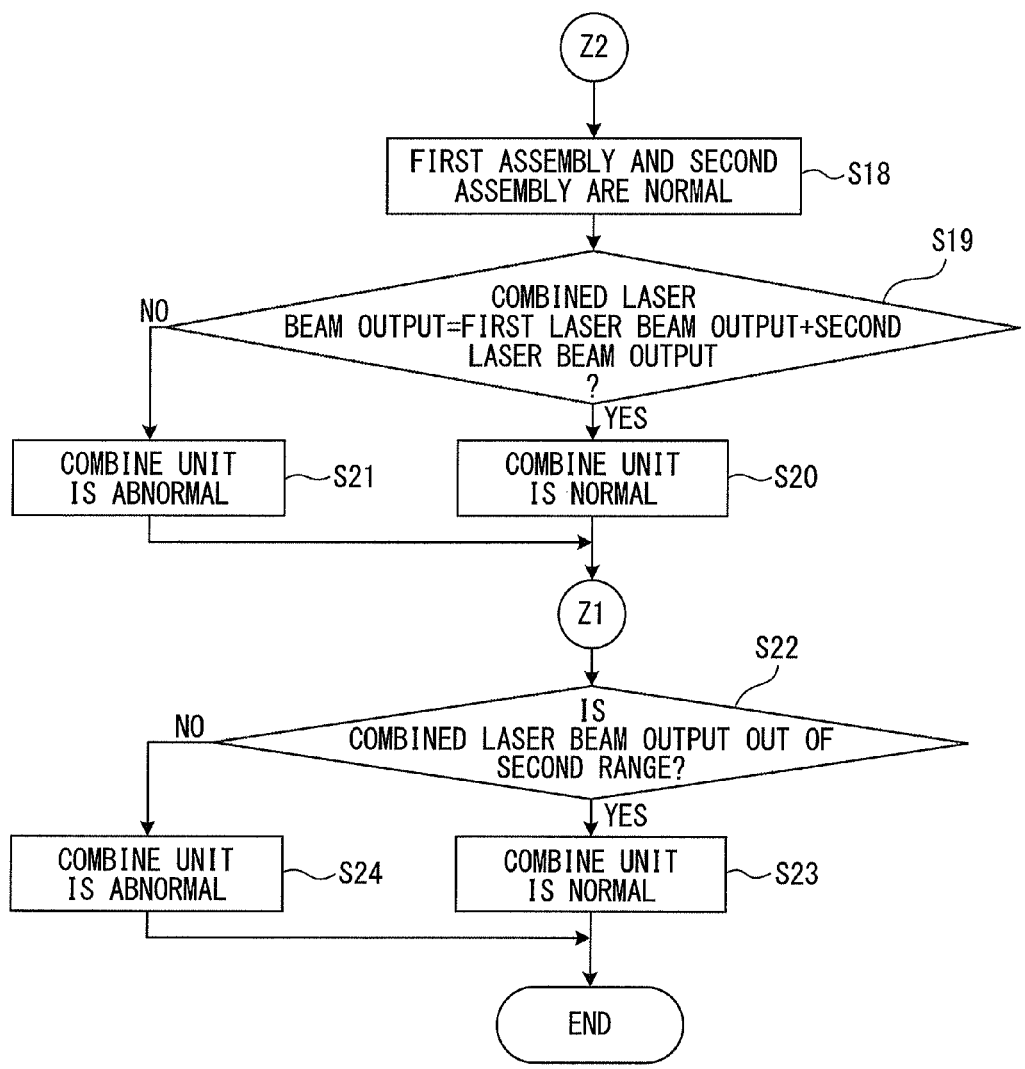
FIG. 2B is a first flowchart of the operation of the control apparatus shown in FIG. 1.

FIGS. 2A and 2B are flowcharts of the operation of a control apparatus according to the present invention. The operation of the control apparatus 30 according to the present invention will be described below with reference to FIGS. 2A and 2B.

First, in step S10, the laser beam output command control unit 31 outputs the first laser beam output command for the first optical unit 12 and the second laser beam output command for the second optical unit 22. The first power unit 11 and the second power unit 21 are driven in response to these commands.

Subsequently, in step S11, the monitor unit 32 acquires the first current output that is the value of electric current passing to the first power unit 11 through the first current detecting unit 13, and the second current output that is the value of electric current passing to the second power unit 21 through the second current detecting unit 23. The monitor unit 32 also acquires the first laser beam output from the first optical unit 12 through the laser beam detecting unit 14, and the second laser beam output from the second optical unit 22 through the laser beam detecting unit 24. The monitor unit 32 also acquires the combined laser beam output from the combine unit 25 through the laser beam detecting unit 26.

Subsequently, in step S12, the abnormality determining unit 33 calculates the first deviation between the first laser beam output command and the first laser beam output, and the second deviation between the second laser beam output command and the second laser beam output. The abnormality determining unit 33 also determines whether the first deviation and the second deviation are out of the predetermined first range. Note that the predetermined first range and the other ranges that will be described later are previously obtained by, for example, an experiment.

When at least one of the first deviation and the second deviation is out of the first range, the process shifts to step S14. When both the first deviation and the second deviation are not out of the first range, the abnormality determining unit 33 determines that no abnormality has occurred in both the first assembly 10 and the second assembly 20 in step S18 of FIG. 2B.

The following description is made on the assumption that the first deviation and the second deviation are not out of the first range. When the first deviation is out of the first range, the abnormality determining unit 33 determines that the first assembly 10 has an abnormality (step S14a). Likewise, when the second deviation is out of the first range, the abnormality determining unit 33 determines that the second assembly 20 has an abnormality (step S14b). Note that, in such a case, the abnormality determining unit 33 may inform, in the form of an alarm, an operator of the fact that the first assembly 10 and the second assembly 20 have abnormalities.

Subsequently, the process shifts to step S15, and then the abnormality determination stopping unit 37 temporarily stops the abnormality determining unit 33 from determining an abnormality. Then the command unit 34 issues a predetermined current command to the first power unit 11 for only a predetermined period of time (step S15a). Likewise, the command unit 34 issues a predetermined current command to the second power unit 21 for the same period of time (step S15b). The predetermined current command is previously determined by, for example, an experiment.

Thus, the first power unit 11 and the second power unit 21 are driven based on the predetermined current commands. Subsequently, in step S16a, the first current relationship between the predetermined current command and the first current output monitored by the monitor unit 32, and the first laser beam relationship between the first laser beam output command of the first optical unit 12, which corresponds to the predetermined current command, and the first laser beam output monitored by the monitor unit 32 are acquired, and stored in the storage unit 35.

Likewise, in step S16b, the second current relationship between the predetermined current command and the second current output monitored by the monitor unit 32, and the second laser beam relationship between the second laser beam output command of the second optical unit 22, which corresponds to the predetermined current command, and the second laser beam output monitored by the monitor unit 32 are acquired, and stored in the storage unit 35.

Subsequently, in step S17a, the estimation unit 36 estimates whether the first power unit 11 or the first optical unit 12 in the first assembly 10 has an abnormality by a method that will be described later. Likewise, in step S17b, the estimation unit 36 estimates whether the second power unit 21 or the second optical unit 22 in the second assembly 20 has an abnormality.

FIG. 3 is a flowchart of determination made by an estimation unit which determines an abnormality in a first power unit or a first optical unit. The operation of step S17a will be described in detail with reference to FIG. 3. Note that the operation of step S17b is substantially similar to that of step S17a, and accordingly, the description of the operation of step S17b is omitted.

First, in step S31, a first current deviation between the predetermined current command and the first current output is acquired from the first current relationship. Then, in step S32, whether the first current deviation is out of a predetermined current range is determined. The predetermined current range is previously obtained by, for example, an experiment. When the first current deviation is out of the predetermined current range, the estimation unit 36 estimates, in step S33, that the first power unit 11 has an abnormality. When the first current deviation is not out of the predetermined current range, the estimation unit 36 estimates, in step S34, that the first power unit 11 is normal.

Subsequently, in step S35, a first laser beam deviation between the first laser beam output command and the first laser beam output is acquired from the first laser beam relationship. Then, in step S36, whether the first laser beam deviation is out of a predetermined laser beam range is determined. The predetermined laser beam range is previously obtained by, for example, an experiment. When the first laser beam deviation is out of the predetermined laser beam range, the estimation unit 36 estimates, in step S37, that the first optical unit 12 has an abnormality. When the first laser beam deviation is not out of the predetermined laser beam range, the estimation unit 36 estimates, in step S38, that the first optical unit 12 is normal.

Referring again to FIG. 2B, when it is determined, in step S18, that the first assembly 10 and the second assembly 20 are normal, the estimation unit 36 estimates, in steps S19 to S21, whether the combine unit 25 has an abnormality.

Specifically, the estimation unit 36 determines, in step S19, whether the combined laser beam output is equal to the sum of the first laser beam output and the second laser beam output. When the combined laser beam output corresponds to the sum of the first laser beam output and the second laser beam output, or is within the allowable amount of attenuation, the fact that the combine unit 25 is normal is estimated in step S20. When the combined laser beam output is lower than the amount of attenuation allowable for the sum of the first laser beam output and the second laser beam output, the fact that the combine unit 25 has an abnormality is estimated in step S21. In this respect, the estimation unit 36 may inform, in the form of an alarm, an operator of the fact that the combine unit 25 has an abnormality.

When it is determined, in step S14, that at least one of the first assembly 10 and the second assembly 20 has an abnormality, the estimation unit 36 estimates, in steps S22 to S24, whether the combine unit 25 has an abnormality.

Specifically, the estimation unit 36 determines whether the combined laser beam output is within a predetermined second range. When the combined laser beam output is within the predetermined second range, the fact that the combine unit 25 is normal is estimated in step S23. Further, when the combined laser beam output is not within the predetermined second range, the fact that combine unit 25 has an abnormality is estimated in step S24.

As seen above, in the present invention, a predetermined current command is issued, in step S15, to the first assembly 10 and/or the second assembly 20, which have been determined to have an abnormality in step S14, for only a predetermined period of time, and the abnormality determining unit 33 is temporarily stopped. While the predetermined current command is issued, the first and second current relationships and the first and second laser beam relationships are acquired and stored, and which unit or units in the units included in the first assembly 10 and/or the second assembly 20 have an abnormality is estimated based on these relationships.

Further, in the present invention, regardless of whether the first assembly 10 and the second assembly 20 have an abnormality, the presence of abnormality in the combine unit 25 can be estimated based on the combined laser beam output (step S19, step S22).

Thus, in the present invention, which unit or units have an abnormality in the power units 11 and 21 and/or the optical units 12 and 22, and the combine unit 25 in the first assembly 10 and/or the second assembly 20 can be estimated in a short time without the generation of an alarm. Such an estimation operation is automatically performed, and accordingly, an operator can check normality or abnormality in each unit without opening the cabinet of the laser oscillator 5. Thus, in the present invention, the man-hours for recovery of the laser oscillator 5 can be drastically reduced.

When only the first deviation is out of the first range in step S13 of FIG. 2A, the second assembly 20 is normal, and accordingly, steps S14b to S17b may be omitted. Likewise, when only the second deviation is out of the first range, the first assembly 10 is normal, and accordingly, steps S14a to S17a may be omitted.

However, even when it is determined that only one of the first assembly 10 and the second assembly 20 has an abnormality, it is preferable that both steps S14a to S17a and steps S14b to S17b be executed. Suppose that, for example, it is determined that the first assembly 10 has an abnormality and the second assembly 20 is normal. In this case, it is preferable that steps S15b to S17b for the second assembly 20 are first executed, and steps S15a to S17a for the first assembly 10 are subsequently executed.

This is because, even if a predetermined current command is issued in step S15a when the first assembly 10 has an abnormality, the first power unit 11 and/or the first optical unit 12 might refuse to respond. When steps S15b to S17b for the second assembly 20 which is determined to be normal are first executed, even if the process shown in FIGS. 2A and 2B is stopped in the middle of the process, the second current relationship and the second laser beam relationship for the second assembly 20 can be acquired. Further, whether the second assembly 20, which has been determined to be normal by the abnormality determining unit 33, is actually normal can be estimated again by the estimation unit 36. Thus, the reliability of the determination made by the abnormality determining unit 33 can be enhanced.

In the meantime, the predetermined current command used in steps S15a and S15b may be a simmer current command. The simmer current command is a minute electric current command based on which the laser does not oscillate, that is, a laser beam is not output. Acquiring the current relationship, etc., using the simmer current command enables determination of whether each unit can operate until the preparatory state for the start of laser oscillation is established, or is insulated by an electrical breakdown.

When the output characteristics (current value, voltage value, etc.) of the power units 11 and 21 are different from those of the power units 11 and 21 in a normal state while the simmer current is commanded, the estimation unit 36 can estimate that the power units 11 and 21 are abnormal (step S33).

When it is determined that the power units 11 and 21 are normal, if electrical responses in response to the simmer current command are not measured from the optical units 12 and 22, electrical breakdowns occur in the optical units 12 and 22, and accordingly, the estimation unit 36 can estimate that the optical units 12 and 22 are abnormal (step S36).

In addition, in steps S15a and S15b, the predetermined current command may be output in a short time, for example, 20 milliseconds. In this instance, no sufficient output may be obtained. However, as long as a certain amount of output is obtained, the estimation unit 36 can estimate that the optical units 12 and 22 are abnormal, based on the failures in the light sources 12a, 12b, 22a, and 22b within the optical units 12 and 22.

Alternatively, the predetermined current command in steps S15a and S15b may be changed in a stepwise manner from the simmer current command to a maximum rated output command. In this instance, for example, the magnitude of an output obtained in response to a certain level of current command can be found. Thus, whether a laser processing is maintained by changing the current command can be estimated. Further, the characteristics of the intensity of an actual laser beam in response to the current command can be verified.

Note that, in an embodiment of the present invention, which is not illustrated, the laser oscillator 5 does not include the combine unit 25. In such a case, the combined laser beam output is not acquired in step S11, and steps S19 to S24 shown in FIG. 2B are omitted. In the not illustrated embodiment, it will be obvious that effects similar to the aforementioned effects can be obtained.

Figure 4:
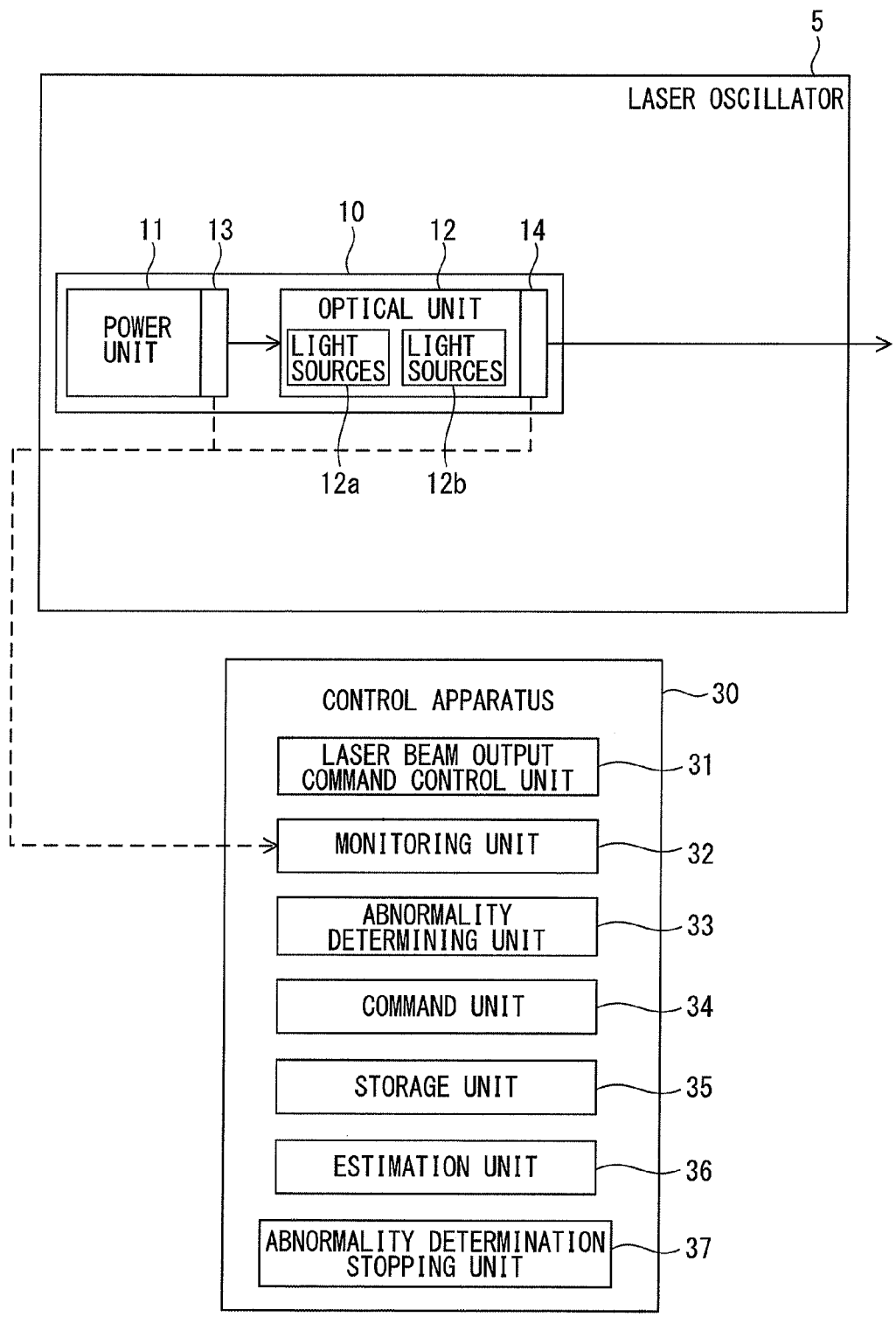
FIG. 4 is a block diagram of the function of a control apparatus according to another embodiment of the present invention.

FIG. 4 is a block diagram of the function of a control apparatus according to another embodiment of the present invention. As shown in FIG. 4, a laser oscillator 5 in another embodiment includes only a single assembly 10 including a power unit 11 and an optical unit 12, and does not include another assembly and a combine unit 25.

In this instance, it will be obvious that the current output, etc., of only the assembly 10 are acquired in step S11, and only the first deviation is acquired in step S12. Further, steps S14b to S17b shown in FIG. 2A and steps S19 to S24 shown in FIG. 2B are omitted, and a combined laser beam output is not acquired.

In other words, in another embodiment, when it is determined, in step S14a, that the single assembly 10 has an abnormality, whether the power unit 11 or the optical unit 12 has an abnormality can be estimated. Thus, in another embodiment, effects similar to the aforementioned effects can be obtained.

Effect of the Invention

In the first aspect of the invention, which unit or units have an abnormality in the power unit and/or the optical unit in the first assembly and/or the second assembly can be estimated in a short time without the generation of an alarm. Such an estimation operation is automatically performed, and accordingly, an operator can check normality or abnormality of each unit without opening the cabinet of the laser oscillator. Thus, in the present invention, the man-hours for recovery of the laser oscillator can be drastically reduced.

In the second aspect of the invention, whether the combine unit has an abnormality can be further estimated.

In the third aspect of the invention, even when the process is stopped in the middle of the process, at least a relationship regarding an assembly which is determined to be normal can be acquired.

In the fourth aspect of the invention, the characteristics of the laser oscillator are measured by issuing only a simmer current command, and accordingly, whether each unit can operate until the preparatory state for the start of oscillation of the laser oscillator is established, or is insulated by an electrical breakdown can be determined. Further, in comparison with the characteristics of current or voltage obtained by issuing a simmer current command during a normal operation, a failure of each power unit can be determined. When each power unit is normal, if electrical responses in response to the simmer current command are not measured from the optical units while the simmer current command is issued, electrical breakdowns can be estimated to occur in the optical units.

In the fifth aspect of the invention, the predetermined current command is output for a predetermined period of time, for example, 20 milliseconds. When a certain output value which does not reach a predetermined output value is confirmed in the optical units, electrical failures of the light sources within the optical units can be estimated. Note that the predetermined current command is issued for a relatively short period of time, and accordingly, a simple absorber can be used for a laser beam.

In the sixth aspect of the invention, the predetermined current command is changed in a stepwise manner, and accordingly, the relationship between the current command and the detected current value can be multilaterally observed. For example, the magnitude of an output obtained in response to a certain level of current command can be found. Thus, whether a laser processing is maintained by changing the current command can be estimated. Further, the characteristics of the intensity of an actual laser beam in response to the current command can be verified.

In the seventh aspect of the invention, which unit or units have an abnormality in the power unit and the optical unit in a single assembly can be estimated in a short time without the generation of an alarm. Such an estimation operation is automatically performed, and accordingly, an operator can check normality or abnormality in each unit without opening the cabinet of the laser oscillator. Thus, in the present invention, the man-hours for recovery of the laser oscillator can be drastically reduced.

The present invention has been described above using exemplary embodiments. However, a person skilled in the art would understand that the aforementioned modifications and various other modifications, omissions, and additions can be made without departing from the scope of the present invention.

What is claimed is:

1. A control apparatus for controlling a laser oscillator including:
    a first assembly comprised of a first power unit and a first optical unit having at least one light source driven by the first power unit; and
    a second assembly comprised of a second power unit and a second optical unit having at least one light source driven by the second power unit, the control apparatus comprising:
    a laser beam output command control unit for controlling a first laser beam output command for the first optical unit and a second laser beam output command for the second optical unit;
    a monitoring unit for monitoring a first current output from the first power unit and a second current output from the second power unit, and a first laser beam output from the first optical unit and a second laser beam output from the second optical unit;
    an abnormality determining unit which determines an abnormality of the first assembly based on a first deviation between the first laser beam output command and the first laser beam output and which determines an abnormality of the second assembly based on a second deviation between the second laser beam output command and the second laser beam output;
    a command unit for issuing a predetermined current command to at least one of the first power unit and the second power unit when the abnormality determining unit determines that at least one of the first assembly and the second assembly has an abnormality;
    an abnormality determination stopping unit for stopping the abnormality determining unit from determining an abnormality when at least one of the first power unit and the second power unit is driven based on the predetermined current command;

a storage unit for storing, when at least one of the first power unit and the second power unit is driven based on the predetermined current command, at least one of a first current relationship between the predetermined current command and the first current output monitored by the monitoring unit, a second current relationship between the predetermined current command and the second current output monitored by the monitoring unit, a first laser beam relationship between the first laser beam output command of the first optical unit, which corresponds to the predetermined current command, and the first laser beam output monitored by the monitoring unit, and a second laser beam relationship between the second laser beam output command of the second optical unit, which corresponds to the predetermined current command, and the second laser beam output monitored by the monitoring unit; and an estimation unit for estimating an abnormality in at least one of the first power unit, the second power unit, the first optical unit, and the second optical unit, based on at least one of the first current relationship, the second current relationship, the first laser beam relationship, and the second laser beam relationship, which are stored by the storage unit.

2. The control apparatus according to claim 1, further comprising a combine unit for combining the first laser beam output from the first optical unit and the second laser beam output from the second optical unit, to output the combined output, wherein the monitoring unit further monitors a combined laser beam output combined by the combine unit, and the estimation unit further estimates an abnormality in the combine unit based on the combined laser beam output.

3. The control apparatus according to claim 1, wherein, when the abnormality determining unit determines that one of the first assembly and the second assembly has an abnormality, the command unit first issues the predetermined current command to a power unit for the other of the first assembly and the second assembly, and subsequently issues the predetermined current command to a power unit for the one of the first assembly and the second assembly.

4. The control apparatus according to claim 1, wherein the predetermined current command is a simmer current command.

5. The control apparatus according to claim 1, wherein the predetermined current command is output for a predetermined period of time.

6. The control apparatus according to claim 1, wherein the predetermined current command is changed in a stepwise manner from a simmer current command to a maximum rated output command.

7. A control apparatus for controlling a laser oscillator including an assembly comprised of a power unit and an optical unit having at least one light source driven by the power unit, the control apparatus comprising:

a laser beam output command control unit for controlling a laser beam output command for the optical unit;

a monitoring unit for monitoring a current output from the power unit and a laser beam output from the optical unit;

an abnormality determining unit for determining that the assembly has an abnormality when a deviation between the laser beam output command and the laser beam output is larger than a predetermined threshold value;

a command unit for issuing a predetermined current command to the power unit when the abnormality determining unit determines that the assembly has an abnormality;

an abnormality determination stopping unit for stopping the abnormality determining unit from determining an abnormality when the power unit is driven based on the predetermined current command;

a storage unit for storing, when the power unit is driven based on the predetermined current command, a current relationship between the predetermined current command and the current output monitored by the monitoring unit, and a laser beam relationship between a laser beam output command of the optical unit, which corresponds to the predetermined current command and the laser beam output monitored by the monitoring unit; and an estimation unit for estimating an abnormality in at least one of the power unit and the optical unit, based on at least one of the current relationship stored by the storage unit and the laser beam relationship.

* * * * *